United States Patent

Frech et al.

[11] Patent Number: 5,812,380
[45] Date of Patent: Sep. 22, 1998

[54] MESH PLANES FOR MULTILAYER MODULE

[75] Inventors: Roland Frech, Ostfildern; Bernd Garben, Schönaich; Hubert Harrer, Böblingen; Erich Klink, Schönaich, all of Germany

[73] Assignee: International Business Machines Corporation, Armonk, N.Y.

[21] Appl. No.: 765,526

[22] PCT Filed: Jun. 7, 1995

[86] PCT No.: PCT/EP95/02194

§ 371 Date: Jan. 9, 1997

§ 102(e) Date: Jan. 9, 1997

[87] PCT Pub. No.: WO96/41376

PCT Pub. Date: Dec. 19, 1996

[51] Int. Cl.$^6$ .............. H05K 1/03; H05K 1/09; H05K 1/16
[52] U.S. Cl. .......... 361/794; 174/255; 174/257; 361/792
[58] Field of Search .............. 29/830, 831, 832, 29/846; 156/252, 253, 254, 257, 268, 276; 174/255–258, 260, 261, 51; 257/700, 723, 724, 786, 728; 333/181, 184, 185, 246, 247; 361/780, 792–795; 428/209, 901; 439/68, 47

[56] References Cited

U.S. PATENT DOCUMENTS

| | | | |
|---|---|---|---|
| 4,880,684 | 11/1989 | Boss et al. | 428/209 |
| 5,016,085 | 5/1991 | Hubbard et al. | 361/780 |
| 5,132,613 | 7/1992 | Papae et al. | 361/794 |
| 5,371,653 | 12/1994 | Kametani et al. | 361/780 |
| 5,378,927 | 1/1995 | McAllister et al. | 257/773 |
| 5,410,107 | 4/1995 | Schaper | 174/255 |
| 5,488,540 | 1/1996 | Hatta | 361/794 |
| 5,568,682 | 10/1996 | Gates, Jr. et al. | 29/831 |
| 5,631,807 | 5/1997 | Griffin | 361/794 |
| 5,677,847 | 10/1997 | Walling | 364/488 |
| 5,761,051 | 6/1998 | Tran | 361/794 |

*Primary Examiner*—Donald Sparks
*Attorney, Agent, or Firm*—Marc A. Ehrlich

[57] ABSTRACT

A multilayer module for packaging at least one electronic component 50. The module includes a plurality of thickfilm layers, and a wiring structure 45 to permit the connection of on-module capacitors. The multilayer module is fabricated such that the wiring structure includes a partial mesh plane 46, 47, 48, and 49 between the topmost and second topmost layers of the thickfilm. Logic noise is reduced in the multilayer module by maximizing the mutual inductance between adjacent mesh planes.

10 Claims, 4 Drawing Sheets

STATE OF THE ART

MESH PLANES FOR MULTILAYER MODULE

The invention relates to a multilayer module including an on-module capacitor for producing stabilized power performance and noise reduction for the electronic components therein.

Multilayer modules are used for the packaging of electronic components, especially integrated circuit chips. Both single chip modules (SCM) and multi chip modules (MCM) are widely used. The most common type of such modules is the multilayer ceramic packaging module. In this type of module the layers of the module consist of a ceramic or glass-ceramic material. However, other types of thickfilm technology are known, such as glass epoxy and teflon.

The basic technology of multilayer modules was first described by A. J. Blodgett and D. R. Barbour "Thermal Conduction Module: A High-Performance Multilayer Ceramic Package," IBM Journal of Research and Development 26 (1), pp. 30–36 January 1982 and by A. J. Blodgett, "Microelectronic Packaging," Scientific American, 249 (1), pp. 86–96, January 1983. These articles are incorporated herein by reference. The technology of multilayer modules is also described in "microelectronics packaging handbook", edited by R. R. Tummala and E. J. Rymaszewski, New York, 1988, especially in chapter 7 entitled "Ceramic Packaging", pp. 455–522 which is also included herein by reference.

As integrated circuit speeds and packaging densities increase, the importance of the packaging technology becomes increasingly significant. For example, as devices approach gigahertz speed, inductance effects and the like in the packaging become more significant. Such inductance effects may arise from, for example, switching and the like, and are particularly problematic in power and ground leads. Inductance effects in the package can cause ground bounce, signal cross-talk and the like. Increasing circuit size and speed also impact the heat dissipation ability of the packaging.

VLSI and ULSI chips are designed for high performance applications and are thus particularly limited by noise. The noise is caused by a high number of simultaneous switching off-chip drivers (OCD noise) and by a high number of simultaneous switching latches and the associated logic gates (logic noise). Both noise sources impact and restrict the on-chip and off-chip performance and jeopardize the signal integrity. Both noise sources generate noise due to line to line coupling and due to the collapse of the voltage-ground (GND) system. It is known in the art, to use on-module capacitors to stabilize the power system. Thereby a major noise reduction is achieved.

FIG. 1 shows a cross section through a standard multilayer ceramic module. The module 13 comprises the layers L11, L12, L13, . . . , L17, . . .

A first ground plane GND is interposed between the layers L12 and L13. A first voltage plane VH is interposed between the layers L13 and L14. Between the layers L14 and L15 there is a first redistribution plane R1 and between the layers L15 and L16 there is a second ground plane GND. Between the layers L16 and L17 there is a second redistribution plane R2. A typical multilayer multichip module has about 5 redistribution planes which are followed by the signal distribution layers, also called "X/Y wiring area". In contrast a single chip module generally only has redistribution planes for the fanout of the wiring and not signal distribution layers.

Between the topmost layer L11 and the second topmost layer L12 there is no significant wiring due to restrictions of the technology. In particular, it is not possible to interpose a ground or voltage plane between the layers L11 and L12 according to the prior art. Hence, on the backside of the layer L11—which is denoted LB1—there is no or only very little wiring such as for test purposes.

The integrated circuit chip 10 shown in FIG. 1 has a plurality of C4—balls 11 which serve to connect the integrated circuit chip 10 to the module 13. The decoupling capacitor Cm 12 has also C4 balls 11 which serve to connect the decoupling capacitor 12 to the module 13. In the example shown in FIG. 1 the integrated circuit chip 10 is mounted face downward. This is due to the C4 technology employed. The C4 technology is described in more detail in "microelectronics packaging handbook", edited by R. R. Tummala and E. J. Rymaszewski, in chapter 6.3, pp. 366–391. However, other types of chip-to-package interconnections are possible such as wire bonding. The integrated circuit chip 10 and the decoupling capacitor 12 are thereby attached to the top surface of the topmost layer L11 of the module 13, which is denoted TSM.

The redistribution planes R1, R2, . . . serve to fan out the signals from the integrated circuit chip 10. All redistribution planes R1, R2, . . . are embedded between voltage VH and GND mesh planes and form thereby triplet structures which have extremely low coupling values.

The on-module capacitor Cm is to be connected to the via holes 14 and 15 in the module 13. The viahole 14 connects one terminal of the on-module capacitor Cm 12 to the first voltage plane VH. The viahole 15 connects the second terminal of the capacitor 12 to the first ground plane GND. The first ground plane GND and the first voltage plane VH are to be connected by viaholes 16 and 17 to the integrated circuit chip 10. Thereby a connection between the capacitor 12 and the chip 10 can be established. As a consequence the power system is stabilized and a major noise reduction is achieved. However, especially for high performance applications, an improved multilayer module is desirable.

It is therefore an object of the invention to provide an improved multilayer module. The object of the invention is solved by the features set forth in claim 1.

The multilayer module according to the invention is advantageous in that logic and OCD noise in single- and multi-chip modules is significantly reduced, for example by more than 20%. This is made possible by the increase of the efficiency of the on-module capacitors. The efficiency is improved by a partial mesh plane, which can be a voltage VH or a ground GND mesh plane, applied directly below the topmost layer of thickfilm of the multilayer module. Thereby usage is made of the otherwise unused topmost and second topmost layers of thickfilm.

This structure simplifies the multilayer module since the total layer count is reduced. Since this reduction takes place in the top area of the module where the vertical via density is highest, the via coupling created by in the dense uppermost area is also reduced. As a consequence of the reduced logic and OCD noise, the performance and the signal integrity are improved.

If the partial mesh plane is aligned with its nearest mesh plane in the module, the mutual inductance of the partial mesh plane and the mesh plane nearest to the partial mesh plane can be maximized. As a consequence the resulting inductance of the mesh planes is minimized and thus the noise is further reduced. The mutual inductance of the partial mesh plane and the nearest mesh plane takes a maximum value, if for example the partial mesh plane is a copy from a part of the underlying nearest mesh plane or—in other words—if a projection of the nearest mesh plane in a direction substantially perpendicular with respect to this plane completely covers the partial mesh plane. In this case the partial mesh plane and the nearest mesh plane are parallel to each other and the respective wiring structures of the mesh planes are aligned in the vertical direction which is defined by the parallel planes.

The usage of a complete mesh plane between the topmost and the second topmost of the layers of thickfilm of the multilayer module is not possible due to the restrictions of the thickfilm technology. Such a structure is not manufacturable. The high metal loading of a complete mesh plane close to the topmost layer would impact the flatness of the module. This can cause cracking of the connections to the integrated circuit chip which does not bend correspondingly. This problem is already contemplated in U.S. Pat. No. 4,880,684. Therefore it is advantageous to minimize the size of the partial mesh plane in order to reduce the mechanical stress in the top area of the module. This minimization can be accomplished, if the partial mesh plane is designed to have a shape corresponding approximately to the expected current flow fields between the on-module capacitor or capacitors and the electronic components to be packaged.

If one would assume the partial mesh plane to be a full size mesh plane covering the whole module like the other mesh planes in the module then only a limited area of this full size mesh plane would serve to conduct the current from the on-module capacitor to the packaged electronic component. If for example the electronic component is placed above the center of the full size mesh plane and the on-module capacitor is placed at the perimeter of the full size mesh plane, this results in an non-homogeneous current flow field from the on-module capacitor to the electronic component. In practice only those portions of the full sized mesh plane where there is a substantial amount of current flow contribute to the conduction of the current. Other portions of the full size mesh plane, especially those portions of the full sized mesh plane near its perimeter where no on-module capacitors or electronic components are placed have a current flow density approximating zero. These areas of the full sized mesh plane where the expected current flow fields approximate zero can be left out without substantially influencing the distribution of the current flow. If these portions of the full sized mesh plane are left out, this results in a partial mesh plane covering a minimum area of the module but featuring ideal electrical characteristics. Again it is advantageous to copy this optimized partial mesh plane from portions of the underlying nearest mesh plane in order to maximize the corresponding mutual inductance.

According to a preferred embodiment of the invention an on-module capacitor comprises a plurality of capacitors which are connected in parallel. Thereby the self-inductance of the on-module capacitor is minimized.

The multilayer module according to the invention preferably is housed by a so called thermal-conduction module. The thermal-conduction module serves to cool the integrated circuit chips mounted on the surface of the multilayer module. Such a thermal-conduction module as such is known from A. J. Blodgett, "Microelectronic Packaging," Scientific American 249 (1), pp. 76–86, July 1983.

A multilayer module according to the invention can be used to package the integrated circuit chips of a computer system. Such a computer system features improved reliability due to reduction of noise. Furthermore, such a computer system can be operated at higher speeds since the improved signal to noise ratio allows the application of a higher clock frequency. One way of carrying out the invention is described in more detail below with reference to drawings which illustrate only one specific embodiment in which.

Figure 2:
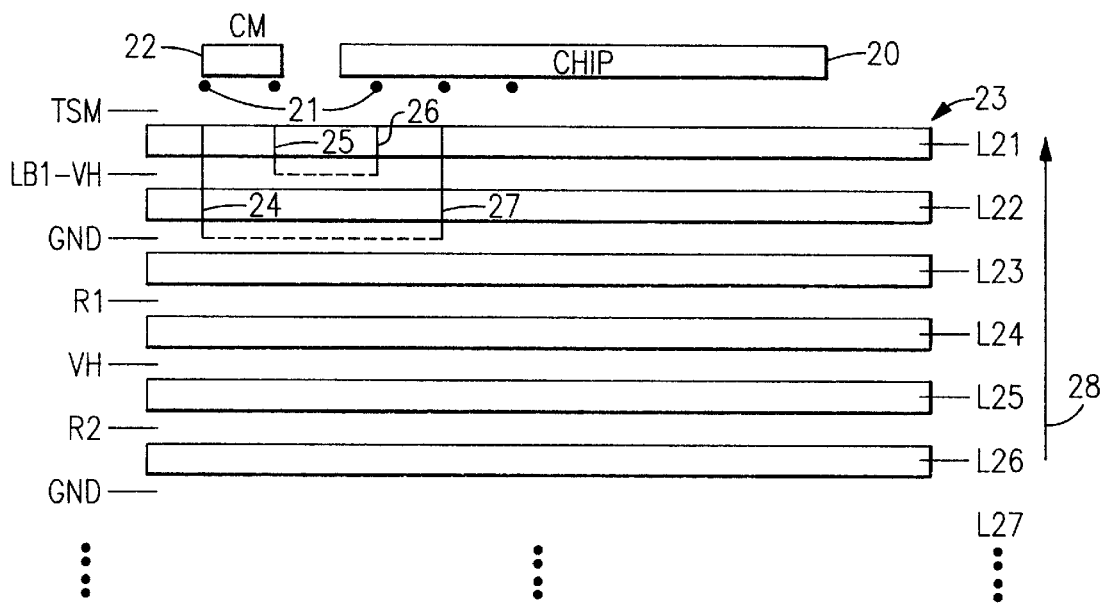
FIG. 2 is a schematic, simplified cross sectional view of a multilayer module according to the invention.

The multilayer module of FIG. 2 comprises a plurality of layers of thickfilm L21, L22, L23, . . . ,L27, . . .

Figure 1:
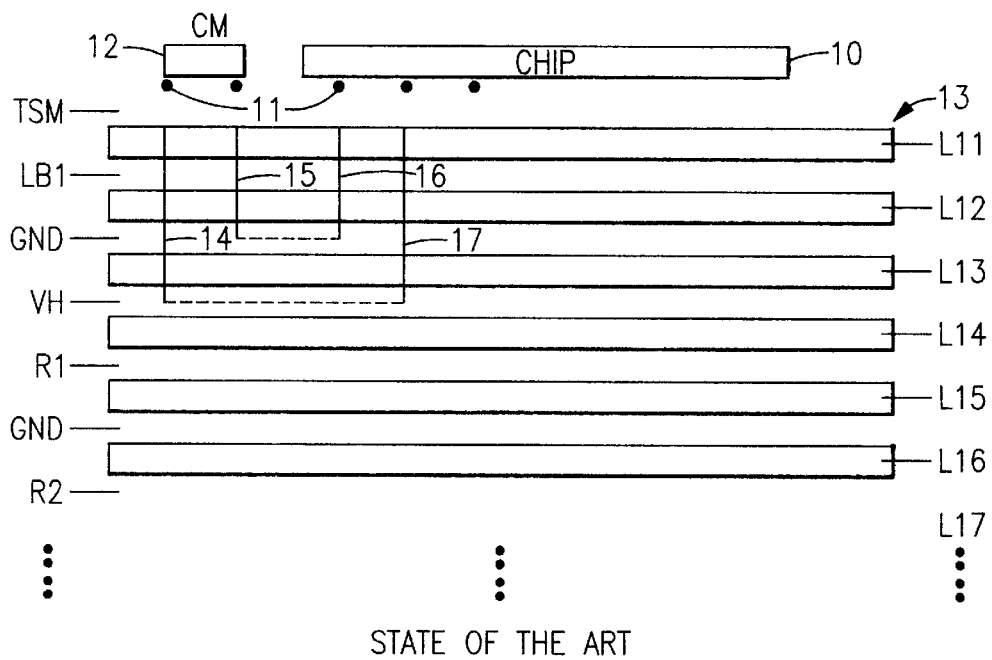
FIG. 1 is a schematic cross sectional view of a state of the art multilayer module.

As compared to the multilayer module shown in FIG. 1 the multilayer module of FIG. 2 has a voltage plane VH sandwiched between the topmost layer L21 and the second topmost layer L22. With other words: The lower backside LB1 of the topmost layer L21 is used now to realize a voltage mesh plane. This voltage mesh plane LB1-VH is a partial mesh plane according to the invention. This makes the usage of the lower backside LB1 possible and overcomes the restrictions of the thickfilm technology which prohibited the realization of a mesh plane or other type of wiring structure between the topmost and the second topmost layers of the module. Due to the usage of a partial voltage mesh plane the maximum allowable stress imparted to the substrate is not exceeded.

Between the layers L22 and L23 there is a full sized ground plane GND. After layer L23 the redistribution area starts with the first redistribution layer R1. Between the layers L24 and L25 there is a further voltage plane VH, followed by a second redistribution layer R2 between layers L25 and L26, which in turn is followed by a ground layer GND between layers L26 and L27. The further layers of the multilayer module are not shown in the drawing.

A chip 20 to be packaged by the multilayer module 23 is shown in the drawing. The chip 20 has C4-balls 21 to connect the chip 20 to the module 23. The on-module capacitor Cm 22 which is to be connected to the multilayer module 23 has also C4-balls 21 to connect the capacitor to the module. One terminal of the on-module capacitor 22 is connected to the via 24 which connects this terminal to the first ground plane GND between the layers L22 and L23. The via 25 connects the second terminal of the on-module capacitor 22 to the partial voltage mesh plane LB1-VH between the topmost layer L21 and the second topmost layer L22. The vias 26 and 27 connect the corresponding terminals of the chip 20 to the partial voltage mesh plane LB1-VH and to the first ground plane GND, respectively.

In the multilayer module of FIG. 1 as well as in the multilayer module of FIG. 2 the topmost thickfilm layers L11 and L21 are about 0.15 mm thick. The following layers L12, L13, L14 . . . and L22, L23, L24, . . . each are about 0.20 mm thick. As a consequence the length of the vias 15 and 16 in FIG. 1 is about 0.35 mm and the length of the vias 14 and 17 is about 0.55 mm. As opposed to this, the vias 25 and 26 in the multilayer module of the invention shown in FIG. 2 are only about 0.15 mm thick and the vias 24 and 27 are only 0.35 mm thick. The shorter length of the vias is made possible by the partial mesh plane LB1-VH between the topmost and the second topmost layer L21, L22. Because of the partial mesh plane the vias 25 and 26 have only to pass the topmost layer L21 of the module 23 since the electrical contact with the partial voltage plane LB1-VH is already established at the lower backside LB1 of the layer L21. This compares to the first voltage plane VH in FIG. 1 which is situated between the 3rd and the 4th layer from the top L13 and L14 and thus has to be connected by the relatively long vias 14 and 17.

Since the length of the vies is reduced according to the invention this implies also a reduction of the inductance and thus noise is also reduced. This is explained in more detail with reference to the equivalent circuit diagram shown in FIG. 3.

Figure 3:
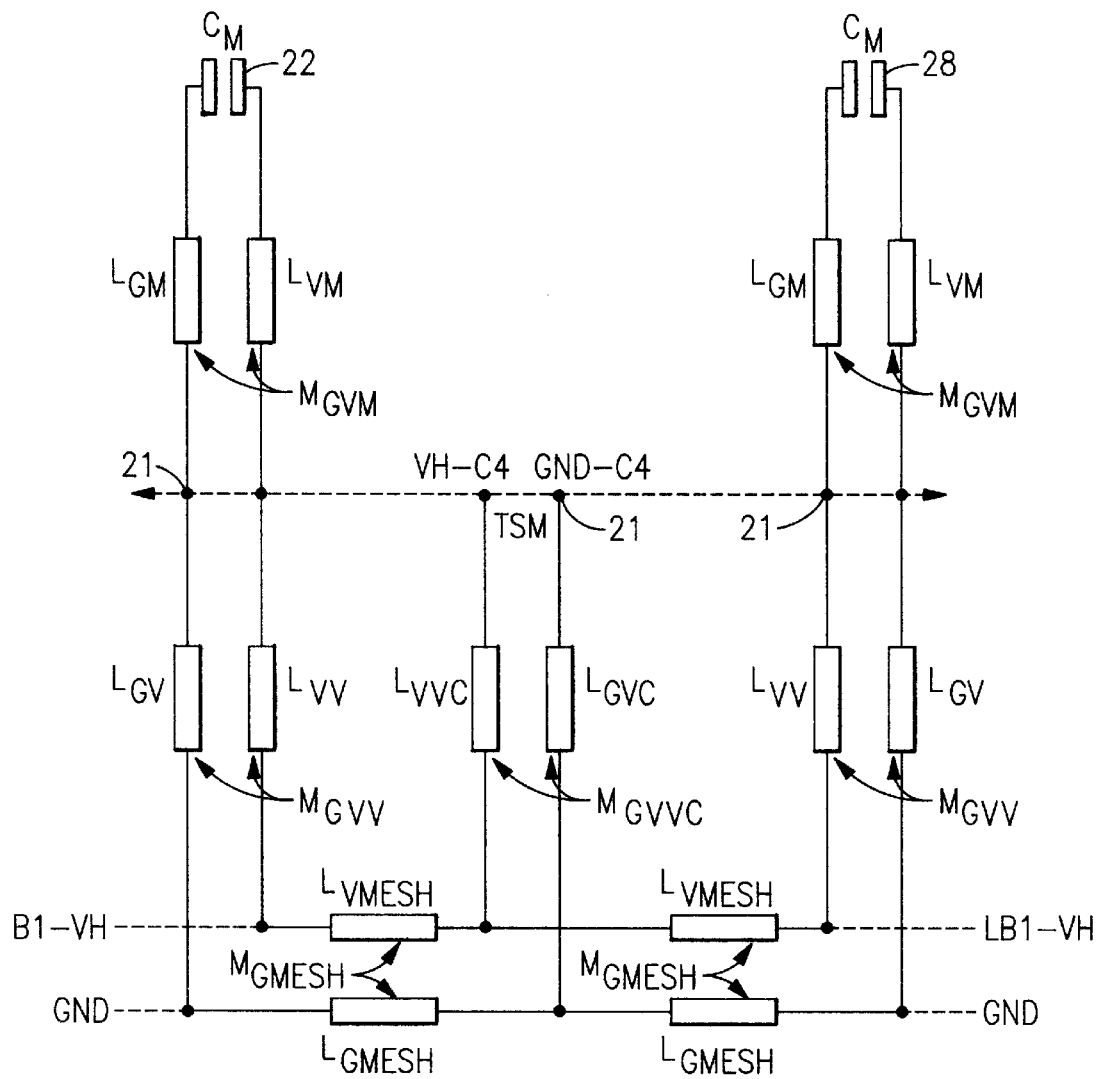
FIG. 3 is a equivalent circuit diagram of the partial mesh plane and its nearest mesh plane taking into account only the inductances.

The equivalent circuit diagram of FIG. 3 shows the equivalent circuit of the connection of two capacitors Cm 22 and 28 to the chip 20 via the multilayer module 23 and the C4-balls 21. As opposed to FIG. 2 two identical capacitors Cm 22 and 28 are shown. The equivalent circuit of FIG. 3 is simplified as it shows no resistive and capacitive path contributions in order to explain the most important electrical aspects which are due to the inductances in the path.

The capacitors 22 and 28 are connected by respective C4-balls 21 to the top surface TSM of the multilayer module 23. The capacitors 22 and 28 have an equivalent inductance Lgm and Lvm in their respective ground and voltage paths. These inductances are representative of the self-inductances of the capacitors 22 and 28 and of the capacitance of the conductors to the C4-balls 21. The C4-balls 21 connect the capacitors 22 and 28 to respective vias which in turn establish a connection to the partial voltage mesh plane LB1-VH and to the ground plane GND, respectively. The equivalent inductances Lgv and Lvv are representative of the inductance of vias 24 and 25, respectively. The vias of the capacitor 28 which correspond to the vias 24 and 25 of the capacitor 22 are not shown in FIG. 2. The equivalent inductances Lv mesh and Lg mesh are representative of the self-inductance of the partial power plane LB1-VH and the ground plane GND, respectively. The equivalent inductances Lvvc and Lgvc are representative of the self-inductances of the vias 26 and 27 which connect the partial mesh plane LB1-VH and the ground plane GND to the top surface module TSM and via the C4-balls 21 to the chip 20. The equivalent inductances Lgm and Lvm have an equivalent mutual inductance Mgvm, the equivalent inductances Lgv and Lvv have an equivalent mutual inductance Mgvv, the equivalent inductances Lv mesh and Lg mesh have an equivalent mutual inductance Mgmesh and the equivalent inductances Lvvc and Lgvc have an equivalent mutual inductance Mgvvc.

The inductances Lgv, Lvv and Lvvc, Lgvc are greater the deeper the corresponding vias go into the multilayer module 23. The inductances Lgv and Lvv of the vias connecting the on-module capacitors 22 and 28 to the partial mesh plane LB1-VH and to the ground plane GND are particularly high because of the low number of voltage and ground vias in the area below the on-module capacitances. Since the partial mesh plane LB1-VH is introduced in the multilayer module 23 according to the invention the length of the vias 24, 25, 26 and 27 is substantially reduced and therefore also the corresponding equivalent inductances of these vias. Thereby the efficiency of the on-module decoupling capacitors 22 and 28 is increased.

It is particularly beneficial that the equivalent inductances of the vias which connect the on-module capacitances to the chip 20 is reduced in an area near the top of the multilayer module. In this area the density of signal vias below the chip is highest. For signal vias extending in the vertical direction a triplate structure is not always guaranteed so that these portions of the signal path are most critical as regards signal corruption by noise and cross talk. The decrease of the equivalent inductances Lgv, Lvv and Lvvc, Lgvc reduces the noise problems especially in the upper most area of the multilayer module 23. This noise problem is also helped because one layer of thickfilm is saved in the multilayer module 23 as compared to the multilayer module 13 of FIG. This is because usage is made of the lower backside LB1 of the topmost layer L21. As a consequence the length of the signal vias below the chip 20 which extend in the vertical direction through the multilayer module 23 is also reduced by the thickness of one thickfilm layer, e.g. for example 0.2 mm.

The inductance of an electrical path from one of the on-module capacitors 22, 28 to the chip 20 is mainly determined by the inductance of the viaholes 24, 25, 26 and 27 which connect the capacitors to the voltage and ground mesh planes LB1-VH and GND. This is because the inductances of the mesh planes are relatively small. The shorter the vias and the more vias are used, the lower is this inductance and the more efficient are the on-module capacitors Cm 22, 28. It is preferable to connect the on-module capacitors Cm by a plurality of vias electrically connected in parallel to the respective mesh planes, since the parallel connection of the vias further reduces their respective inductances.

Figure 4:
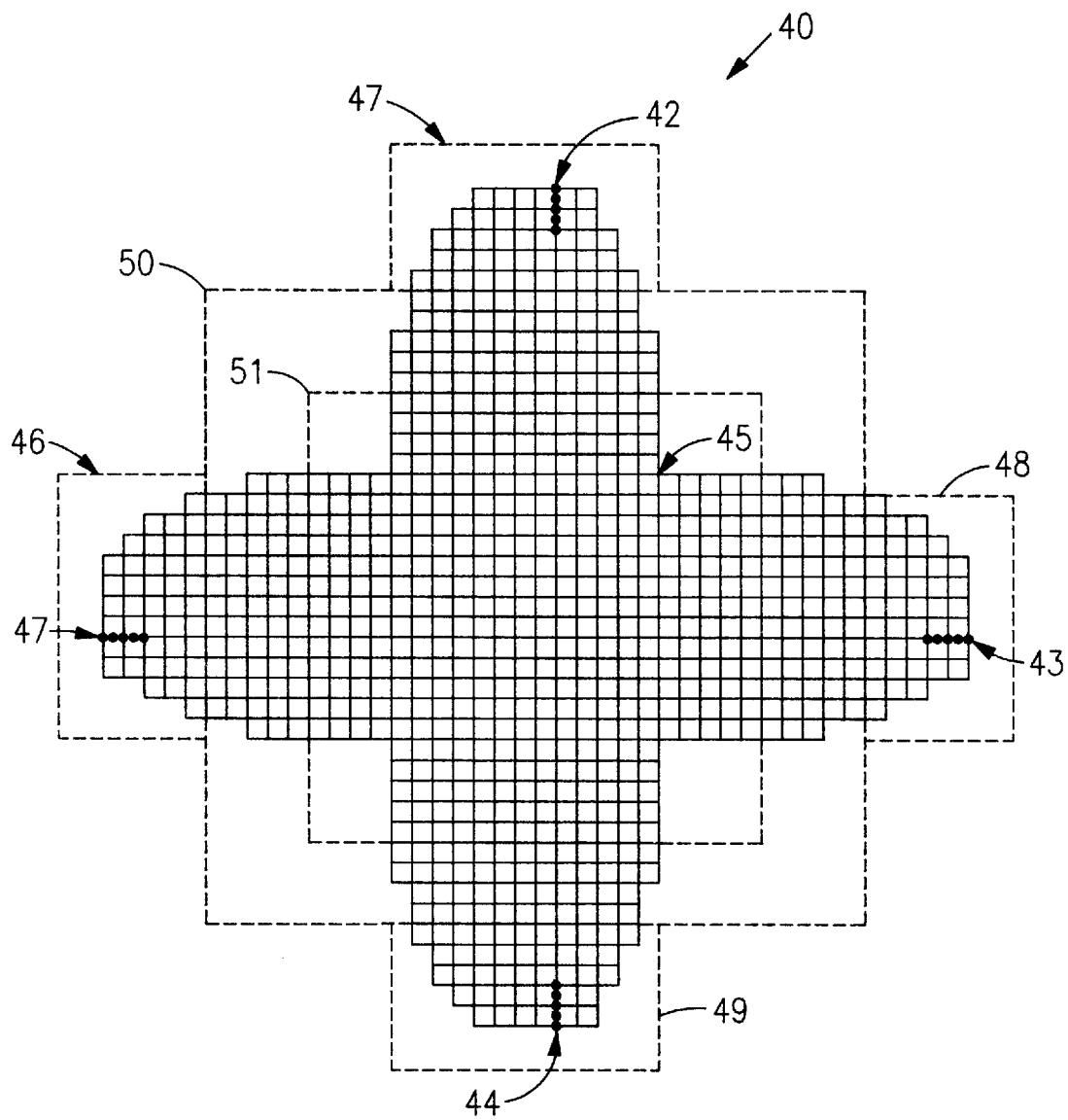
FIG. 4 shows a magnified partial mesh plane according to the invention.

FIG. 4 is a topview of the partial mesh plane LB1-VH. The partial mesh plane consists of a wiring grid 45. The other mesh planes of the multilayer module 23 such as the first ground plane GND between the thickfilm layers L22 and L23 as well as the further power planes VH and GND also consists of such a wiring grid. However, the other mesh planes always cover the entire surface of a thickfilm layer and are of substantially the same shape as the thickfilm layers, i.e. of rectangular shape.

The partial mesh plane according to the invention is only a cut out from such a normal mesh plane. The dashed line 50 in FIG. 4 indicates the square boundary of the integrated circuit chip 20 placed on top of the multilayer module 23. Only relatively small portions 46, 47, 48 and 49 of the partial mesh plane shown in FIG. 4 extend beyond the boundary 50 of the chip 20. These portions are indicated by the respective doted lines 46, 47, 48 and 49 in FIG. 4. These portions of the partial mesh plane which extend beyond the boundary 50 of the chip 20 serve to connect the on-module capacitors to the chip 20. The portion 46 has five vias 41 which correspond to the via 25 shown in FIG. 2. Analogously the portions 47, 48 and 49 have vias 42, 43 and 44. Hence, each of the portions 46, 47, 48 and 49 serves to connect five on-module capacitors to the chip 20. The connection to the chip 20 is established by vias corresponding to the via 26 shown in FIG. 2. These vias are not shown in FIG. 4.

In some cases the spacing of the wiring grid of the partial mesh plane is so narrow that there is not enough space for the signal vias of the chip 20 to penetrate into deeper regions of the module 23 through the partial mesh plane. This can be the case for example for a central portion of the partial mesh plane below the chip 20. Such a portion is indicated by the dashed box 51. In this case that portion 51 of the wiring grid of the partial mesh plane can be—at least partially—left out, so that basically the voltage mesh island 46, 47, 48 and 49 remain. In this case only the voltage and ground pads at the boundary of the chip 20 can be connected to the on-module decoupling capacitors.

In the preferred embodiment of the invention considered here the portions 46, 47, 48 and 49 of the partial mesh plane which serve to contact the on-module capacitors are approximately trapezoidally shaped. This shape of the partial mesh approximates the expected current flow fields from the boundaries of the partial mesh plane—i. e. from the on-module capacitors towards the center where there are the connections to the chip 20. Other geometrical forms which also approximate the expected current flow fields such as an elliptical form are also possible.

Preferably the partial mesh plane shown in FIG. 4 is aligned with respect to the underlying first ground plane GND (cf. FIG. 2) which is situated between the layers L22 and L23. If a projection of the first ground plane GND in a vertical direction 28 completely covers the wiring grid of the partial mesh plane LB1-VH the mutual inductance between these two planes is maximized. This mutual inductance is the inductance Mgmesh shown in the equivalent circuit diagram of FIG. 3. By using the partial voltage mesh plane LB1-VH between the layers L21 and L22 the inductance Lvv is reduced by about 50%.

Figure 5:
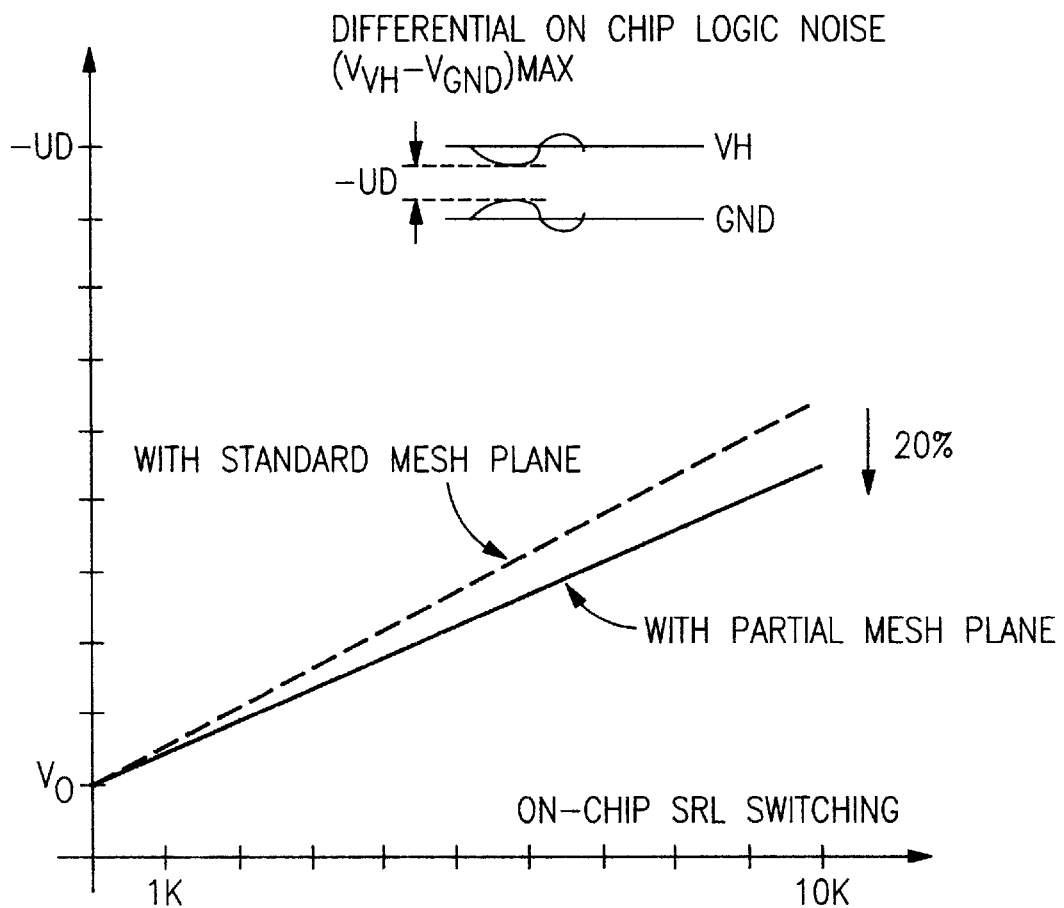
FIG. 5 shows the noise reduction in a multilayer module according to the invention as compared to a corresponding state of the art multilayer module.

The corresponding impact on the noise is shown in FIG. 5. The noise is shown as voltage difference -Ud of the supply voltage VH and the ground voltage GND. This voltage difference is caused by the high number of simultaneous switching latches and logic gates (logic noise). The x-axis of the diagram shown in FIG. 5 is indicative of the number of on-chip shift register latches (SRL) switching. The y-axis of the diagram is indicative of the corresponding voltage difference -Ud. $V_o$ is the voltage difference -Ud which appears when no SRLs are switching. The solid line in FIG. 5 shows how the voltage -Ud depends on the number of SRLs which are switching for the module 23 according to the invention which has a partial mesh plane LB1-VH. The dashed line shows the corresponding dependency for a state of the art module 13 having a standard mesh plane. Using the partial mesh plane reduces the logic noise by more than 20%. This noise reduction is important, because it improves the performance of the entire computer system in addition the signal integrity is improved by increasing the safety margin to receiver noise threshold.

In addition to the reduction of the logic noise, also the driver noise (OCD noise) is reduced. The signal vias, which run in parallel through the dense via area in the upper most thickfilm layers directly below the chip, have the highest coupling contribution in the redistribution area. Due to the reduced via depth by one thickfilm layer (cf. FIGS. 1 and 2), the OCD noise is also reduced by approximately 10 to 20%. It is to be noted, that the invention can be implemented on single- and multichip modules.

We claim:

1. A multilayer module for packaging of at least one electronic component, such as an integrated circuit chip (20), said module comprising a plurality of layers of thickfilm (L21, L22, L23, . . .) and said module having a wiring structure for the connection of at least one on-module capacitor (22,28) characterized in that said wiring structure comprises a partial mesh plane (LB1-VH) between the topmost and the second topmost of said layers of thickfilm.

2. A multilayer module according to claim 1 characterized in that said partial mesh plane is aligned with the nearest mesh plane (GND) of said wiring structure to maximize the mutual inductance of said partial mesh plane and said nearest mesh plane.

3. A multilayer module according to claim 2 characterized in that a projection of said nearest mesh plane in a direction (28) substantially perpendicular with respect to said nearest mesh plane covers said partial mesh plane.

4. A multilayer module according to claim 1 characterized in that said partial mesh plane has a shape corresponding approximately to the expected current flow fields between said on-module capacitor or said on module capacitors and said electronic component in said partial mesh plane.

5. A multilayer module according to claim 3 characterized in that said mesh planes are of gridlike shape.

6. A multilayer module according to claim 1 characterized in that said thickfilm includes ceramic or glass-ceramic material.

7. A multilayer module according to claim 1 having at least one on-module capacitor connected thereto, said on-module capacitor comprising a plurality of capacitors connected in parallel.

8. A multilayer module according to claim 1 having at least one on-module capacitor and at least one electronic component connected thereto.

9. A thermal-conduction module housing a multilayer module according to claim 1.

10. A computer system comprising at least one multilayer module according to claim 1.

* * * * *